(12) United States Patent
Oota

(10) Patent No.: US 8,243,454 B2
(45) Date of Patent: Aug. 14, 2012

(54) ELECTRONIC CONTROL UNIT

(75) Inventor: Shinsuke Oota, Kariya (JP)

(73) Assignee: Denso Corporation, Kariya (JP)

( * ) Notice: Subject to any disclaimer, the term of this patent is extended or adjusted under 35 U.S.C. 154(b) by 139 days.

(21) Appl. No.: 12/834,944

(22) Filed: Jul. 13, 2010

(65) Prior Publication Data

US 2011/0013370 A1 Jan. 20, 2011

(30) Foreign Application Priority Data

Jul. 14, 2009 (JP) ................................ 2009-165622

(51) Int. Cl.
*H05K 7/20* (2006.01)

(52) U.S. Cl. ........ 361/719; 361/704; 361/707; 165/80.3

(58) Field of Classification Search ........................ None
See application file for complete search history.

(56) References Cited

U.S. PATENT DOCUMENTS

| | | | | |
|---|---|---|---|---|
| 5,770,478 A | * | 6/1998 | Iruvanti et al. | 438/122 |
| 5,891,755 A | * | 4/1999 | Edwards et al. | 438/108 |
| 6,365,964 B1 | * | 4/2002 | Koors et al. | 257/718 |
| 6,608,753 B2 | * | 8/2003 | Wakabayashi et al. | 361/719 |
| 6,965,171 B1 | * | 11/2005 | Lee et al. | 257/783 |
| 7,023,699 B2 | * | 4/2006 | Glovatsky et al. | 361/704 |
| 7,268,428 B2 | * | 9/2007 | Edwards et al. | 257/712 |
| 7,576,988 B2 | * | 8/2009 | Schwarz | 361/704 |
| 7,709,951 B2 | * | 5/2010 | Brodsky et al. | 257/713 |
| 7,782,620 B2 | * | 8/2010 | Tomioka et al. | 361/704 |
| 7,813,134 B2 | * | 10/2010 | Katsuro | 361/714 |
| 2003/0184969 A1 | | 10/2003 | Itabashi et al. | |
| 2004/0233640 A1 | | 11/2004 | Itabashi et al. | |
| 2006/0215369 A1 | * | 9/2006 | Ohashi et al. | 361/704 |
| 2007/0045819 A1 | | 3/2007 | Edwards et al. | |
| 2009/0103267 A1 | * | 4/2009 | Wieland et al. | 361/707 |

FOREIGN PATENT DOCUMENTS

| | | |
|---|---|---|
| JP | 2001-244394 | 9/2001 |
| JP | P2004-158814 A | 6/2004 |

OTHER PUBLICATIONS

U.S. Appl. No. 12/834,950, Oota, filed Jul. 13, 2010.
Japanese Office Action dated Oct. 4, 2011, issued in corresponding Japanese Application No. 2009-165622 with English Translation.
Korean Office Action dated Dec. 12, 2011, issued in corresponding Korean Application No. 10-2010-67262 with English Translation.
Chinese Office Action dated Feb. 13, 2012, issued in corresponding Chinese Application No. 201010229209.7 with English Translation.

* cited by examiner

*Primary Examiner* — Boris Chervinsky
(74) *Attorney, Agent, or Firm* — Nixon & Vanderhye PC

(57) ABSTRACT

In an electronic control unit, a semiconductor device that is installed to a circuit board includes a semiconductor chip, multiple leads and a resin body. The semiconductor chip is electrically connected to the circuit board through the leads and is molded in the resin body. A case receives the semiconductor device. A heat releasing gel contacts the semiconductor device, and conducts heat generated from the semiconductor device to a first cover of the case located on one side of the semiconductor device, which is opposite from the circuit board. A groove portion as a movement limiting means is placed at a location between the circuit board and the first cover. Therefore, movement of the heat releasing gel is limited, and heat can be released to a side of the case through the heat releasing gel with high efficiency.

21 Claims, 14 Drawing Sheets

ELECTRONIC CONTROL UNIT

CROSS REFERENCE TO RELATED APPLICATION

The present application is based on Japanese Patent Application No. 2009-165622 filed on Jul. 14, 2009, the disclosure of which is incorporated herein by reference.

FIELD OF THE INVENTION

The present invention relates to an electronic control unit mounted in a vehicle or the like.

BACKGROUND OF THE INVENTION

For example, JP-A-2001-244394 discloses that thermal conductive grease (hereinafter referred to as heat releasing gel) is interposed between a semiconductor package and a heatsink so as to release heat generated from the semiconductor package.

Recently, since a vehicle-mounted motor and an electronic control unit (hereinafter referred to as ECU) for driving the motor are often used, volume occupied by the motor and the ECU tends to be increased. On the other hand, in order to extend vehicle interior space, the space for arranging the motor and the ECU is decreased. Therefore, miniaturization of the motor or the ECU is desired.

For example, since an electronic control unit used for an electronic power steering system (hereinafter referred to as EPS) that assists steering by a driver needs to be energized by large current to drive a motor, and thereby its heating value becomes large. Therefore, it is necessary to improve heat releasing performance while miniaturizing the electronic control unit.

However, as disclosed in JP-A-2001-244394, in the case where the heat releasing gel is used for the ECU of a vehicle to improve the heat releasing performance, there was a problem that the heat releasing gel moves due to the influence of vibration or the like.

SUMMARY OF THE INVENTION

In view of the above-described problem, it is an object of the present invention to provide an electronic control unit with heat releasing gel, which has high heat releasing performance.

According to one aspect of the present invention, an electronic control unit includes a circuit board; a semiconductor device that is installed to the circuit board and includes a semiconductor chip, a plurality of leads and a resin body, wherein the semiconductor chip is electrically connected to the circuit board through the plurality of leads and is molded in the resin body; a case that receives the semiconductor device; a heat releasing gel that contacts the semiconductor device and conducts heat generated from the semiconductor device to a portion of the case located on one side of the semiconductor device, which is opposite from the circuit board; and a movement limiting means for limiting movement of the heat releasing gel at a location between the circuit board and the case.

According to the above configuration, the electronic control unit has the movement limiting means formed at the location between the circuit board and the case. Therefore, the movement of the heat releasing gel is limited, and heat can be released to a side of the case through the heat releasing gel with high efficiency. It is to be noted that the movement limiting means of the present invention is a means for limiting the movement of the heat releasing gel by physical force, that is, forming of a wall or increasing of frictional force, for example. In the present invention, "the case located on one side of the semiconductor device, which is opposite from the circuit board" includes the case, a part of which is located adjacent to a side surface of the semiconductor device by forming a projection on the case located on the one side of the semiconductor device.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
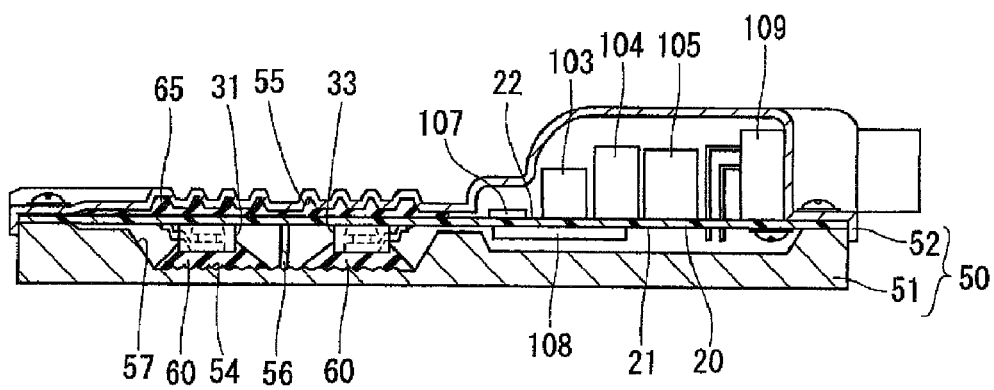
FIG. 1 is a cross-sectional view showing an electronic control unit according to a first embodiment of the present invention.

Hereinafter, embodiments of the present invention will be described with reference to drawings. Similar components in the following embodiments are indicated by the same reference numeral, and descriptions thereof will not be repeated.

First Embodiment

As shown in FIGS. 1 to 4, an electronic control unit (hereinafter referred to as ECU) 1 is used for an EPS of a vehicle, for example, and controls driving of a motor 101 that generates assist force of steering based on a steering torque signal and a vehicle speed signal.

The ECU 1 includes a circuit board 20, power MOSFETs (hereinafter referred to as power MOSs) 31 to 34 as semiconductor devices, a case 50 and the like.

The circuit board 20 is an FR-4 printed wiring board made of glass woven fabric and epoxy resin, for example. Other than the power MOSs 31 to 34, an aluminum electrolytic capacitor 103, a coil 104, a relay 105, a shunt resistance 107, a microcomputer (hereinafter referred to as IC) 108 and the like are installed to the circuit board 20. Moreover, a connector 109 is connected to the circuit board 20. In the present embodiment, the power MOSs 31 to 34 and the IC 108 are placed on a first surface 21 of the circuit board 20, and the aluminum electrolytic capacitor 103, the coil 104, the relay 105, the shunt resistance 107 and the connector 109 are placed on a second surface 22 of the circuit board 20, which is the opposite surface of the first surface 21.

Figure 4:
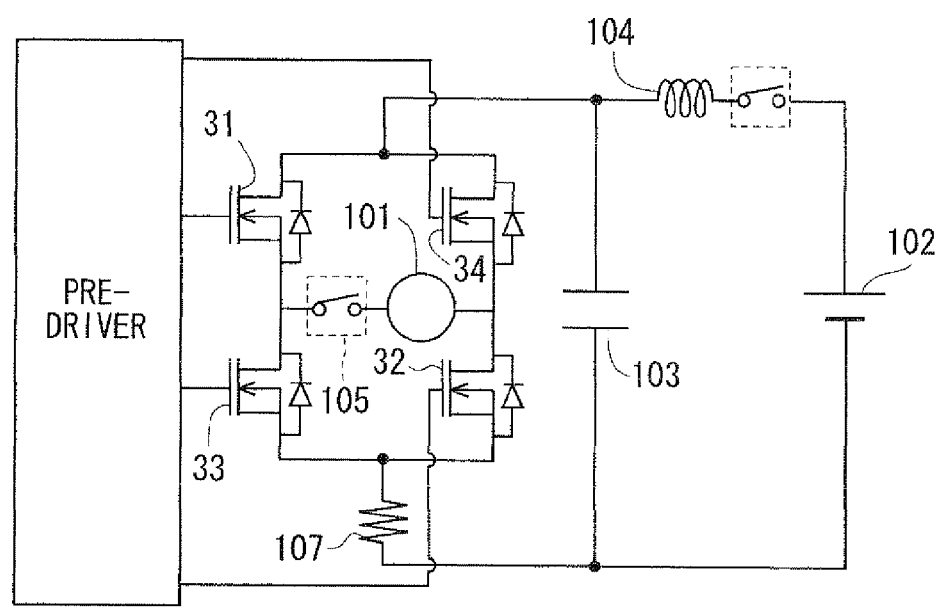
FIG. 4 is a circuit diagram showing the electronic control unit according to the first embodiment of the present invention.

The power MOSs 31 to 34 switch current supplied to the motor 101 from a buttery 102 via the connector 109. As shown in FIG. 4, a drive circuit of the present embodiment is an H-bridge motor drive circuit. When a steering wheel is turned to the right, the two power MOSs 31 and 32, which are located to be symmetrical about the motor 101, are turned on (conduction) so that the motor 101 is driven. At this time, remaining two power MOSs 33 and 34 are turned off (interruption). When the steering wheel is turned to the left, the power MOSs 33 and 34 are turned on and the power MOSs 31 and 32 are turned off so that the motor 101 is driven. When the steering wheel is turned from right to left, the power MOS 32 is turned off before the power MOS 31 is turned off. In contrast, when the steering wheel is turned from left to right, the power MOS 34 is turned off before the power MOS 33 is turned off. At this time, current flows in the power MOS 31 and the power MOS 33. Thus, the heating value generated in the power MOS 31 and the power MOS 33 becomes larger than the heating value generated in the power MOS 32 and the power MOS 33.

The structure of the power MOSs 31 to 34 will be described in detail below.

By storing charge, the aluminum electrolytic capacitor 103 assists the electric power supply to the power MOSs 31 to 34, and controls noise contents such as surge voltage. The coil 104 is placed to reduce noise, and the relay 105 is placed for fail-safe. Based on a steering torque signal and a vehicle speed signal which are inputted via the connector 109, the IC 108 detects a rotating direction and rotating torque of the motor 101 and outputs a signal from a driver so that switching of the power MOSs 31 to 34 is controlled. Furthermore, the IC 108 monitors a temperature of heat generated from the power MOSs 31 to 34.

The case 50 has a first cover 51 and a second cover 52 which are made of an aluminum plate or a zinc steel plate. By forming the case 50 with an aluminum plate or a zinc steel plate not an aluminum die-casting product, weight of the case 50 can be reduced, and therefore, weight of the ECU 1 as a whole can be reduced. The first cover 51 is placed at a side of the first surface 21 of the circuit board 20, and receives the power MOSs 31 to 34 and the IC 108. The second cover 52 is placed at a side of the second surface 22 of the circuit board 20, and receives the electronic components such as the aluminum electrolytic capacitor 103. The first cover 51 is fixed to the second cover 52 by a screw 59 with the circuit board 20 interposed therebetween.

Figure 2:
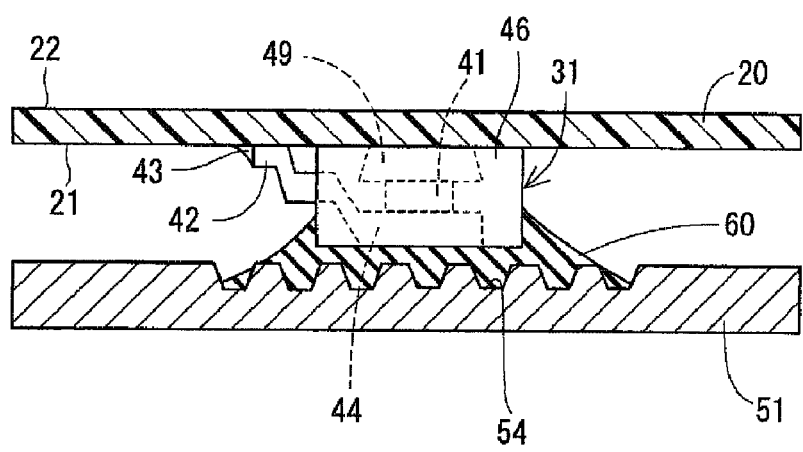
FIG. 2 is an enlarged cross-sectional view of a main part of the electronic control unit according to the first embodiment of the present invention.

Next, the power MOSs 31 to 34 will be described with reference to FIG. 2. FIG. 2 is an enlarged view showing the vicinity of the power MOS 31. Here, the power MOS 31 will be described.

The power MOS 31 includes a semiconductor chip 41, multiple leads 42, a heat releasing plate 44, a resin body 46, and the like. The semiconductor chip 41 is formed on a metal plate 49 exposed to a side of the circuit board 20. The heat releasing plate 44, which is integrally formed with the leads 42, is formed on a surface of the semiconductor chip 41, which is the opposite surface of a surface that is opposed to the circuit board 20. Although the heat releasing plate 44 is integrally formed with the leads 42 in the present embodiment, the heat releasing plate 44 may be formed separately from the leads 42. The leads 42 are electrically connected to a circuit pattern (not shown) formed on the circuit board 20 with a solder 43. The semiconductor chip 41 is electrically connected to the circuit board 20 via the solder 43, the leads 42 and the heat releasing plate 44. The resin body 46 molds the semiconductor chip 41, a part of the respective leads 42, the heat releasing plate 44 and the plate 49. Surfaces of the heat releasing plate 44 and the plate 49 are exposed from the resin body 46.

A heat releasing gel 60 is formed on the power MOS 31 at the opposite side of the circuit board 20, that is, the heat releasing gel 60 is placed between the power MOS 31 and the first cover 51. The heat releasing gel 60 is mainly made from silicone or the like, for example. The heat releasing gel 60 is not hardened after being mounted in the vehicle (for example, after a lapse of 500 hours at 150° C.), and maintains a certain amount of viscosity. The heat releasing gel 60 contacts the power MOS 31, and conducts heat generated from the power MOS 31 to the first cover 51. As shown in FIG. 2, the heat releasing gel 60 is not filled in a space between the circuit board 20 and the first cover 51, but is applied to the power MOS 31 such that a surface of the power MOS 31 at a side of the first cover 51 is covered by the heat releasing gel 60. That is, the heat releasing gel 60 is formed on each of the power MOSs 31 to 34. By forming the heat releasing gel 60, the heat generated from the power MOS 31 is released to the side of the first cover 51. The heat generated from the power MOS 31 is also released to the side of the circuit board 20 through the plate 49.

Figure 3:
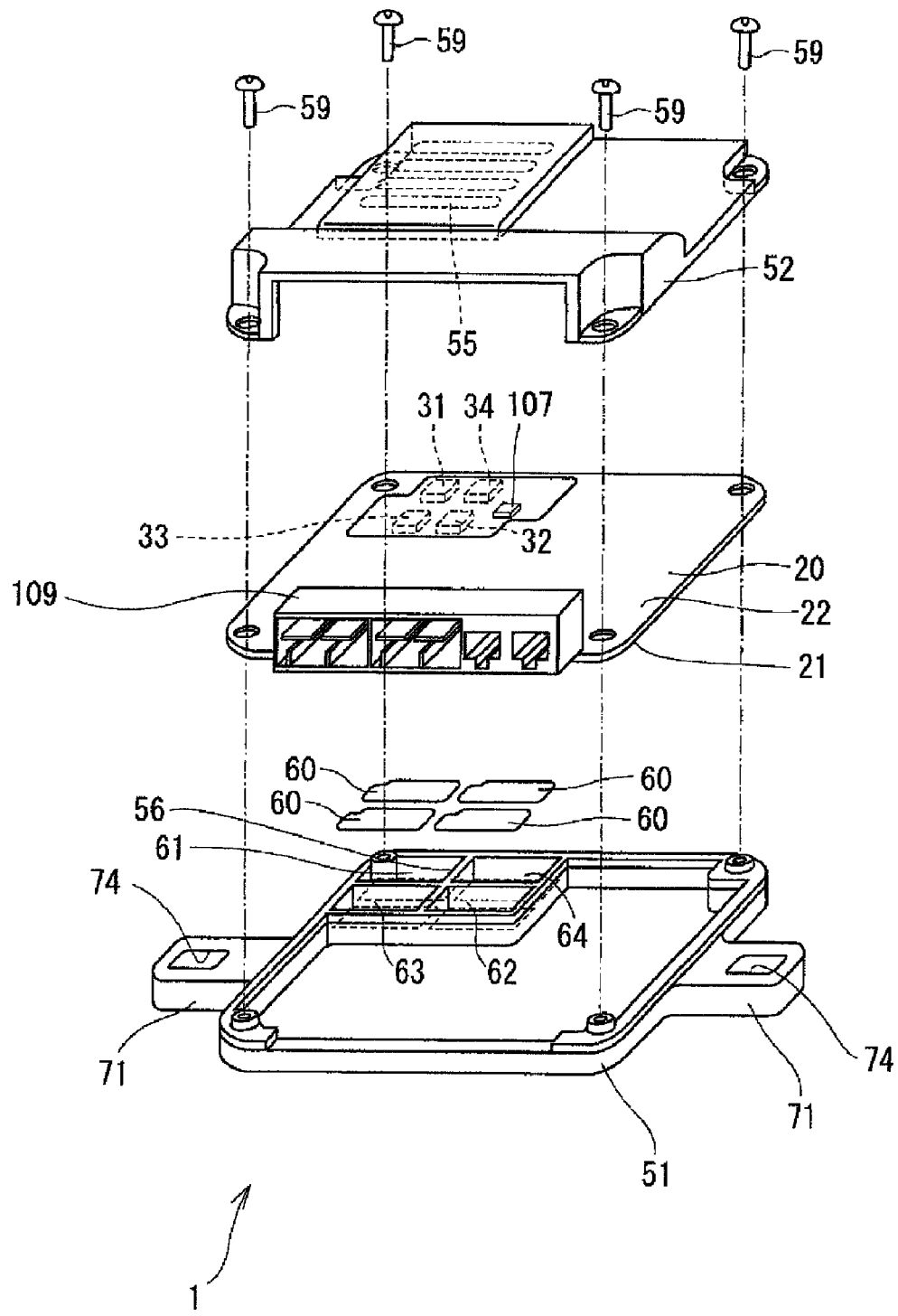
FIG. 3 is an exploded perspective view showing an assembly structure of the electronic control unit according to the first embodiment of the present invention.

The present embodiment has a feature in that a portion of the first cover 51, which is opposed to the power MOS 31, is processed by a press or the like to have a concave-convex surface and a groove portion 54 as a movement limiting means is formed in the portion of the first cover 51. Because of the groove portion 54, the movement of the heat releasing gel 60 is limited. Moreover, as shown in FIGS. 1 and 3, a rib 56 is formed in the first cover 51 so as to separate the power MOSs 31 to 34, and four receiving portions 61 to 64 are formed. The rib 56 also functions as the movement limiting means. The receiving portions 61 to 64 formed by the rib 56 can also be considered as recesses as the movement limiting means.

Furthermore, a heat releasing gel 65 is placed between the circuit board 20 and the second cover 52. The second cover 52 has a groove portion 55 at a portion thereof, which is opposed to the heat releasing gel 65, and thereby the movement of the heat releasing gel 65 is limited.

An assembly method of the ECU 1 will be described with reference to FIG. 3. In FIG. 3, the electronic components other than the power MOSs 31 to 34, the shunt resistance 107 and the connector 109 are not shown.

First, a necessary quantity of the heat releasing gel 60 is applied to the receiving portions 61 to 64 of the first cover 51. The power MOSs 31 to 34 installed to the circuit board 20 are received in the receiving portions 61 to 64, to which the heat releasing gel 60 is applied. The second cover 52 is placed on a surface of the circuit board 20, which is opposite from a surface to which the power MOSs 31 to 34 are installed, and is fixed to the first cover 51 by the screw 59. Then, a screw or the like is inserted into a fixation hole 74 of a fixation portion 71, which protrudes outward from the outer peripheral part of the first cover 51, and the ECU 1 is fixed to the vehicle or the like.

As described above, in the ECU 1 of the present embodiment, the groove portion 54 is formed in the portion of the first cover 51, which is opposed to each of the power MOSs 31 to 34. Thus, the movement of the heat releasing gel 60 due to vibration or the like can be Limited. Moreover, since an area of contact between the heat releasing gel 60 and the first cover 51 is increased, heat releasing performance is improved. The groove portion 55 of the second cover 52 has the similar effect to the groove portion 54.

The heat releasing gel 60 is formed on each of the power MOSs 31 to 34. Moreover, the rib 56 is formed in the first cover 51 so as to separate the power MOSs 31 to 34. Thus, the movement of the heat releasing gel can be limited while saving the amount of the heat releasing gel. Moreover, by forming the rib 56 to provide the receiving portions 61 to 64 for each of the power MOSs 31 to 34, a surface area for radiating heat is increased, and thereby the heat releasing performance is improved. Furthermore, by forming the rib 56, the distortion of the first cover 51 can be limited. The limiting effect of the distortion is obtained by the groove portion 55 of the second cover 52.

Hereinafter, modified examples of the movement limiting means will be described in a second embodiment to an eleventh embodiment. FIGS. 5 to 11 are views corresponding to FIG. 2 of the first embodiment. Only one power MOS is shown in FIGS. 5 to 11. The entire configuration of the ECU 1 is the same with that of the first embodiment, and a description thereof will not be repeated.

Second Embodiment

The second embodiment of the present invention will be described with reference to FIG. 5.

Figure 5:
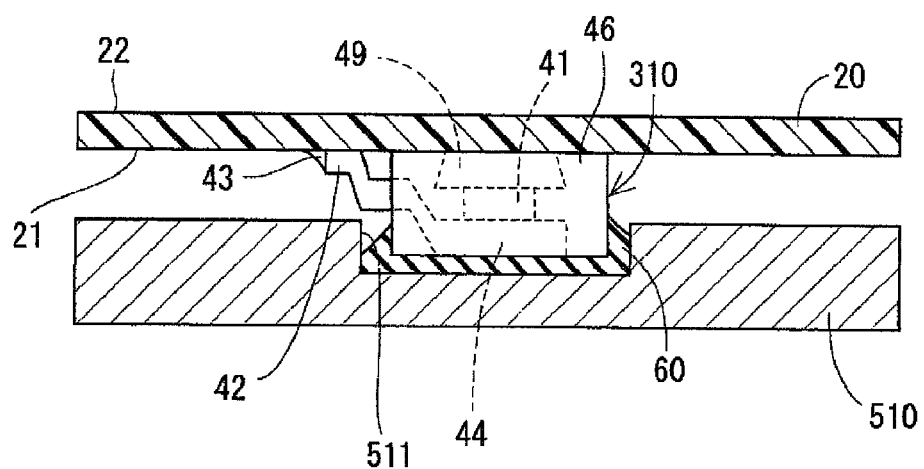
FIG. 5 is a cross-sectional view showing an electronic control unit according to a second embodiment of the present invention.

A power MOS 310 shown in FIG. 5 has the same configuration with the power MOSs 31 to 34 of the first embodiment. A first cover 510 is placed to cover the power MOS 310 at the opposite side of the circuit board 20, that is, the power MOS 310 is placed between the circuit board 20 and the first cover 510. The first cover 510 has a recess 511 as a movement limiting means at a portion thereof, which is opposed to the power MOS 310. The heat releasing gel 60 is applied to the inside of the recess 511. An end portion of the power MOS 310 at the opposite side of the circuit board 20 is received in the recess 511 such that the heat releasing gel 60 is interposed between the power MOS 310 and the first cover 510.

In the present embodiment, the heat releasing gel 60 is received in the space formed inside the recess 511. Thus, as with the above-described embodiment, the movement of the heat releasing gel 60 due to vibration or the like can be limited.

Third Embodiment

The third embodiment of the present invention will be described with reference to FIG. 6.

Figure 6:
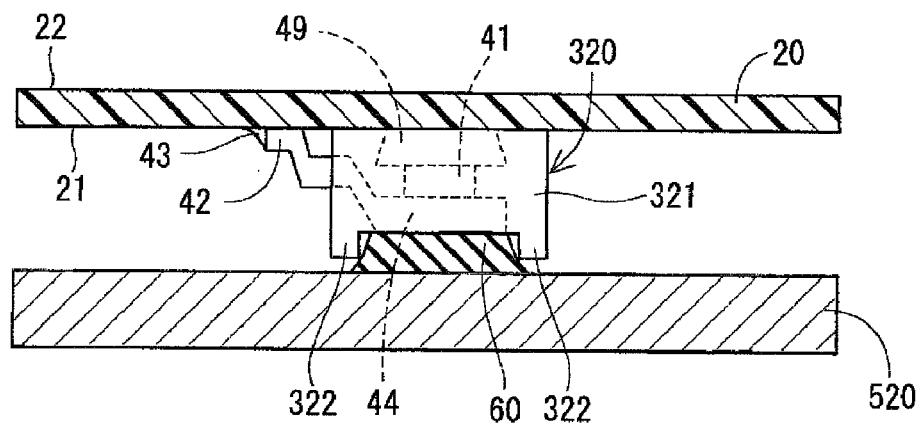
FIG. 6 is a cross-sectional view showing an electronic control unit according to a third embodiment of the present invention.

In a power MOS 320 shown in FIG. 6, a resin body 321 has a projection 322 as a movement limiting means in the outer peripheral part of a surface of the resin body 321, which is opposed to a first cover 520. The heat releasing gel 60 is applied to the inside of the projection 322.

In the present embodiment, the heat releasing gel 60 is received in the space formed inside the projection 322. Thus, as with the above-described embodiments, the movement of the heat releasing gel 60 due to vibration or the like can be limited.

Fourth Embodiment

Figure 7A:
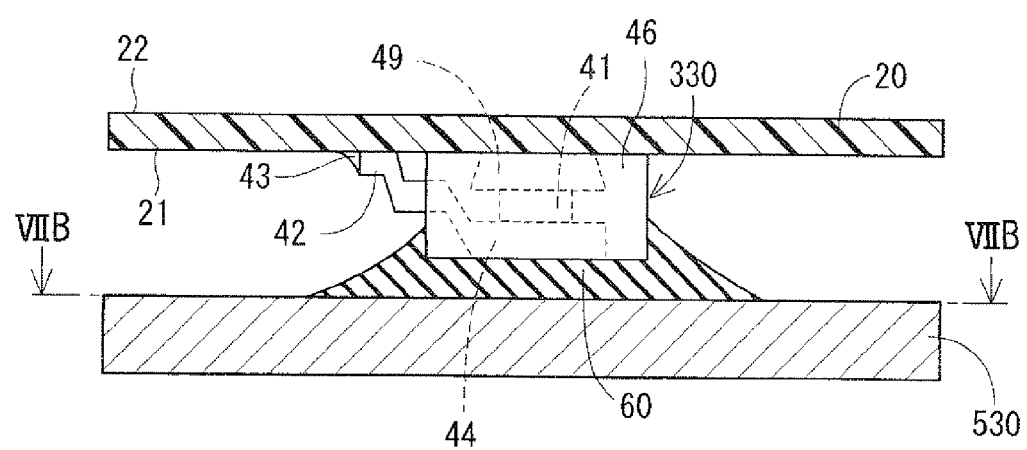
FIG. 7A is a cross-sectional view showing an electronic control unit according to a fourth embodiment of the present invention.
Figure 7B:
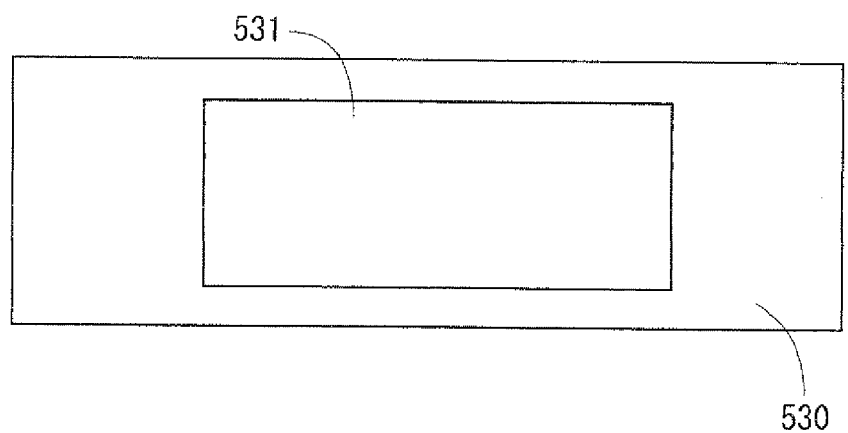
FIG. 7B is a plan view showing the electronic control unit according to the fourth embodiment of the present invention, viewed from a direction shown by the arrow VIIB of FIG. 7A.

The fourth embodiment of the present invention will be described with reference to FIGS. 7A and 7B. FIG. 7A is a view corresponding to FIG. 2 of the first embodiment, and FIG. 7B is a view showing a first cover 530 viewed from a direction shown by the arrow VIIB of FIG. 7A.

A power MOS 330 shown in FIG. 7A has the same configuration with the power MOSs 31 to 34 of the first embodiment. The first cover 530 is placed to cover the power MOS 330 at the opposite side of the circuit board 20, that is, the power MOS 330 is placed between the circuit board 20 and the first cover 530. Furthermore, the heat releasing gel 60 is placed between the power MOS 330 and the first cover 530. In the present embodiment, the first cover 530 has a roughening portion 531 as a movement limiting means at a portion thereof, which contacts the heat releasing gel 60. The roughening portion 531 is formed by shot blasting or roughening plating.

In the present embodiment, since the first cover 530 has the roughening portion 531 at the portion thereof, which contacts the heat releasing gel 60, frictional force between the first cover 530 and the heat releasing gel 60 is increased. Thus, as with the above-described embodiments, the movement of the heat releasing gel 60 due to vibration or the like can be limited.

Fifth Embodiment

The fifth embodiment of the present invention will be described with reference to FIG. 8.

Figure 8:
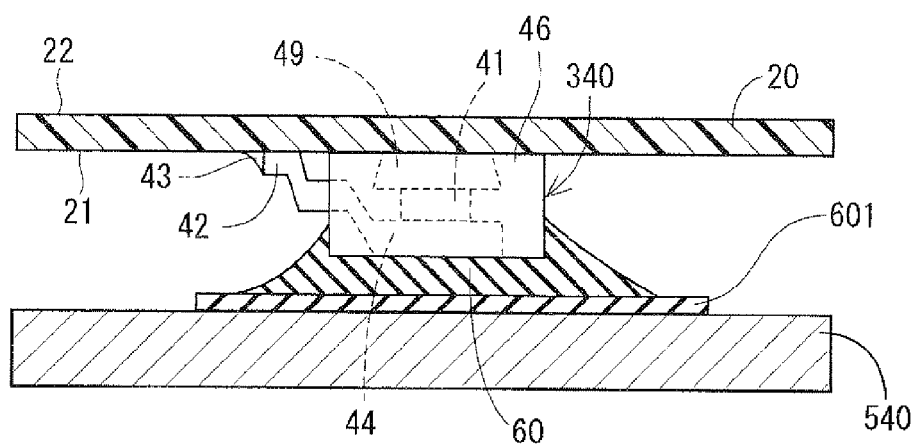
FIG. 8 is a cross-sectional view showing an electronic control unit according to a fifth embodiment of the present invention.

A power MOS 340 shown in FIG. 8 has the same configuration with the power MOSs 31 to 34 of the first embodiment. The heat releasing gel 60 is formed on the power MOS 340 at the opposite side of the circuit board 20. In the present embodiment, a heat releasing sheet 601 having an adhesive property as a movement limiting means is formed between the heat releasing gel 60 and the first cover 540. The heat releasing sheet 601 is mainly made from silicone, and is a high hardness heat releasing sheet. The heat releasing gel 60 is also mainly made from silicone. Thus, the heat releasing gel 60 is easily adsorbed to the heat releasing sheet 601. The heat releasing gel 60 adheres tightly to the heat releasing sheet 601. Therefore, as with the above-described embodiments, the movement of the heat releasing gel 60 due to vibration or the like can be limited.

Sixth Embodiment

The sixth embodiment of the present invention will be described with reference to FIG. 9.

Figure 9:
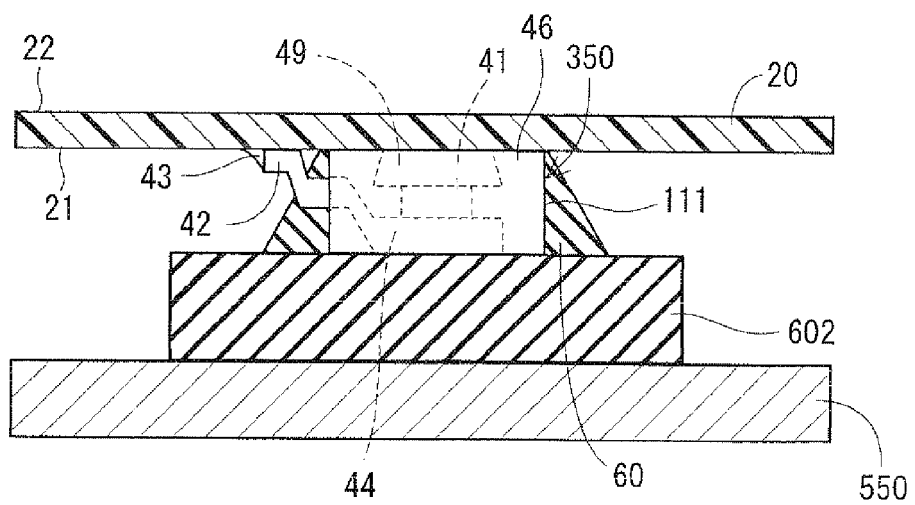
FIG. 9 is a cross-sectional view showing an electronic control unit according to a sixth embodiment of the present invention.

A power MOS 350 shown in FIG. 9 has the same configuration with the power MOSs 31 to 34 of the first embodiment. In the present embodiment, a heat releasing sheet 602 having an adhesive property as a movement limiting means is formed between the power MOS 350 and a first cover 550. The heat releasing sheet 602 is mainly made from silicone. The heat releasing gel 60 is also mainly made from silicone. Thus, the heat releasing gel 60 is easily adsorbed to the heat releasing sheet 602. The heat releasing sheet 602 has hardness lower than the heat releasing sheet 601 of the fifth embodiment, and is formed to be thicker than the heat releasing sheet 601. The heat releasing gel 60 is formed between the circuit board 20 and the heat releasing sheet 602 such that the side surface of the power MOS 350 is surrounded by the heat releasing gel 60.

In the present embodiment, the heat releasing gel 60 adheres tightly to the heat releasing sheet 602. Therefore, as with the above-described embodiments, the movement of the heat releasing gel 60 due to vibration or the like can be limited. Moreover, the heat releasing gel 60 is formed to surround the side surface of the power MOS 350 so that heat is released also from the side surface of the power MOS 350. Thus, the heat releasing performance is improved. Furthermore, in the present embodiment, since the relatively-thick heat releasing sheet 602 having low hardness is used, the heat releasing sheet 602 can absorb stress applied to the circuit board 20.

The heat releasing sheet 601 and the heat releasing sheet 602 correspond to a sheet member.

Seventh Embodiment

Figure 10A:
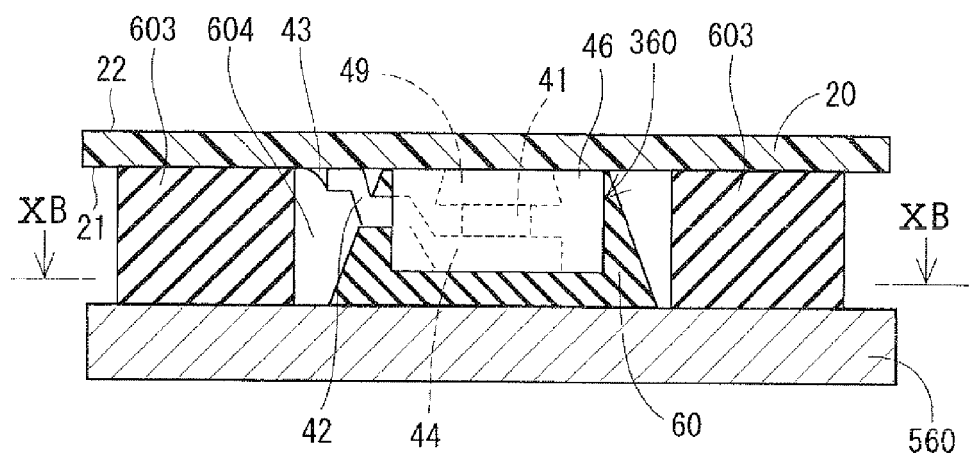
FIG. 10A is a cross-sectional view showing an electronic control unit according to a seventh embodiment of the present invention.
Figure 10B:
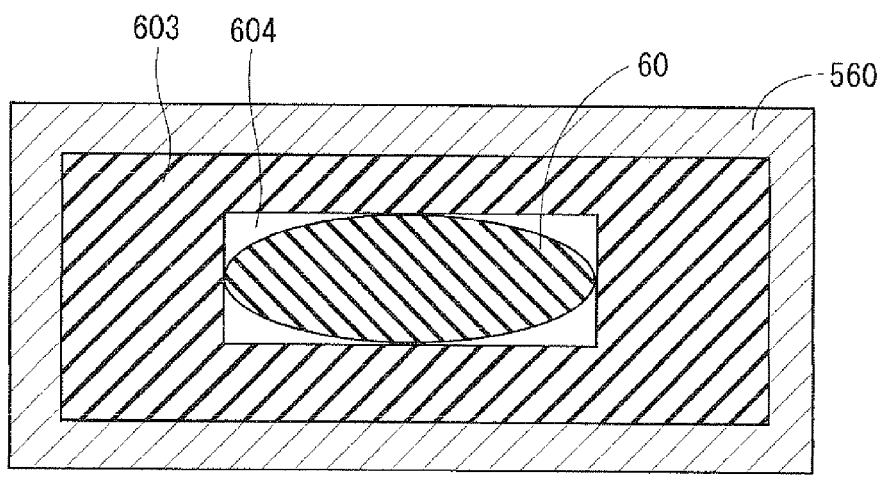
FIG. 10B is a cross-sectional view showing the electronic control unit according to the seventh embodiment of the present invention, taken along the line XB-XB of FIG. 10A.

The seventh embodiment of the present invention will be described with reference to FIGS. 10A and 10B. FIG. 10A is a view corresponding to FIG. 2 of the first embodiment, and FIG. 10B is a cross-sectional view taken along the line XB-XB of FIG. 10A.

A power MOS 360 shown in FIG. 10A has the same configuration with the power MOSs 31 to 34 of the first embodiment. In the present embodiment, a wall portion 603 as a movement limiting means is formed between the circuit board 20 and a first cover 560 so as to surround the side surface of the power MOS 360. The wall portion 603 is made of the same material with the heat releasing sheet 602 of the sixth embodiment. The heat releasing gel 60 is poured into a space 604 surrounded by the inner wall of the wall portion 603, and the power MOS 360 is buried within the heat releasing gel 60 in the space 604.

In the present embodiment, the heat releasing gel 60 is received in the space 604 surrounded by the wall portion 603. Thus, as with the above-described embodiments, the movement of the heat releasing gel 60 due to vibration or the like can be limited. Moreover, the power MOS 360 is buried within the heat releasing gel 60 in the space 604 so that heat is released also from the side surface of the power MOS 360. Thus, the heat releasing performance is improved. Furthermore, since the wall portion 603 is formed to be relatively thick and is made of silicone material having low hardness like the heat releasing sheet 602 of the sixth embodiment, the wall portion 603 can absorb stress applied to the circuit board 20.

Eighth Embodiment

The eighth embodiment of the present invention will be described with reference to FIG. 11.

Figure 11:
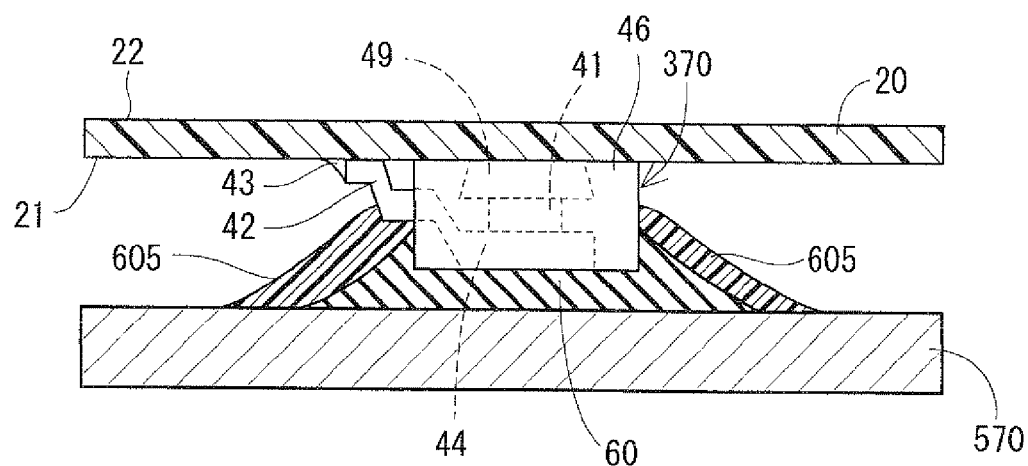
FIG. 11 is a cross-sectional view showing an electronic control unit according to an eighth embodiment of the present invention.

A power MOS 370 shown in FIG. 11 has the same configuration with the power MOSs 31 to 34 of the first embodiment. A first cover 570 is placed to cover the power MOS 370 at the opposite side of the circuit board 20, that is, the power MOS 370 is placed between the circuit board 20 and the first cover 570. Furthermore, the heat releasing gel 60 is placed between the power MOS 370 and the first cover 570. The surface of the heat releasing gel 60 of the present embodiment is covered by a protection member 605 as a movement limiting means. The protection member 605 is formed from a drip-proof member that is mainly made of polyolefin, acrylic, polyurethane and the like, for example. The heat releasing gel 60 is covered by the protection member 605. Thus, as with the above-described embodiments, the movement of the heat releasing gel 60 due to vibration or the like can be limited.

In the ninth to eleventh embodiments of the present invention described below, a movement limiting means is formed in a heat releasing plate.

Ninth Embodiment

The ninth embodiment of the present invention will be described with reference to FIG. 12.

Figure 12:
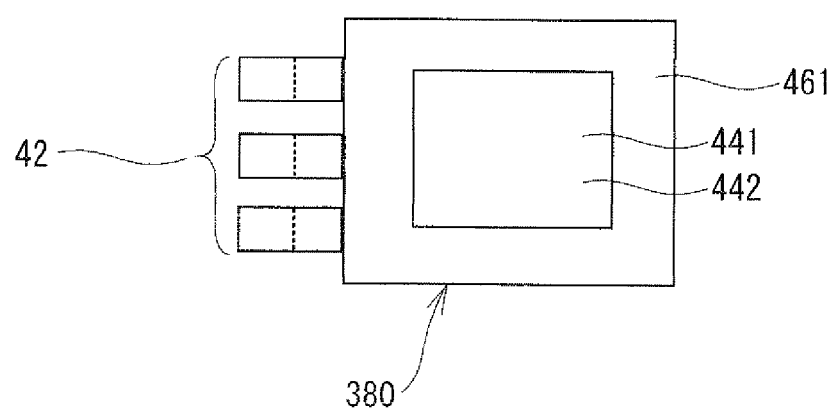
FIG. 12 is a plan view showing an electronic control unit according to a ninth embodiment of the present invention.

FIG. 12 is a plan view of a power MOS 380. In FIG. 12, a circuit board, a heat releasing gel, a case and the like are not shown.

In the power MOS 380 shown in FIG. 12, a heat releasing plate 441 is exposed from a resin body 461 on a surface thereof. The surface is opposite from a surface of the resin body 461, which is opposed to the circuit board (not shown). The heat releasing plate 441 has a roughening portion 442 as a movement limiting means on a surface thereof, which is exposed from the resin body 461. The roughening portion 442 contacts the heat releasing gel. The roughening portion 442 is formed by shot blasting or roughening plating.

In the present embodiment, since the heat releasing plate 441 has the roughening portion 442 at a portion thereof, which contacts the heat releasing gel, frictional force between the heat releasing plate 441 and the heat releasing gel is increased. Thus, as with the above-described embodiments, the movement of the heat releasing gel due to vibration or the like can be limited.

Tenth Embodiment

Figure 13A:
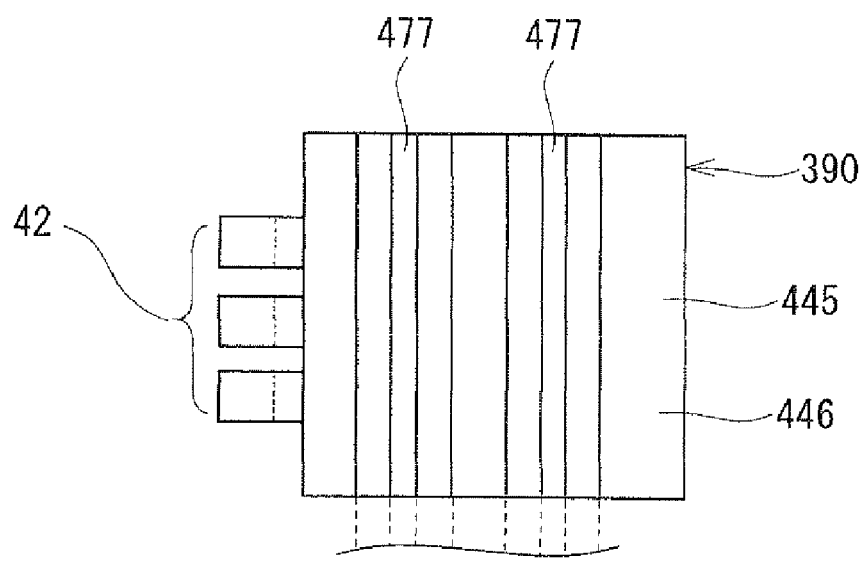
FIG. 13A is a plan view showing an electronic control unit according to a tenth embodiment of the present invention.
Figure 13B:
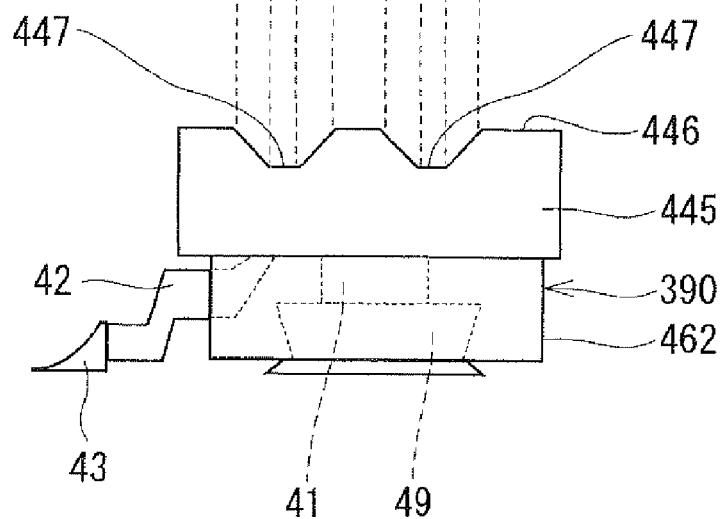
FIG. 13B is a side view showing the electronic control unit according to the tenth embodiment of the present invention.

The tenth embodiment of the present invention will be described with reference to FIGS. 13A and 13B. FIG. 13A is a plan view of a power MOS 390, and FIG. 13B is a side view of the power MOS 390. In FIGS. 13A and 13B, a circuit board, a heat releasing gel, a case and the like are not shown.

In the power MOS 390 shown in FIGS. 13A and 13B, a large portion of a heat releasing plate 445 is exposed to a side of a cover (not shown) from a resin body 462. The heat releasing plate 445 is formed to be larger than the resin body 462. The heat releasing gel is placed between the cover and an end surface 446 of the heat releasing plate 445, which is opposite side of the resin body 462. The end surface 446 has a groove portion 447, which is formed by a press or the like, as a movement limiting means.

In the present embodiment, the groove portion 447 is formed in the end surface 446 of the heat releasing plate 445, which contacts the heat releasing gel. Therefore, as with the above-described embodiments, the movement of the heat releasing gel due to vibration or the like can be limited.

Eleventh Embodiment

Figure 14A:
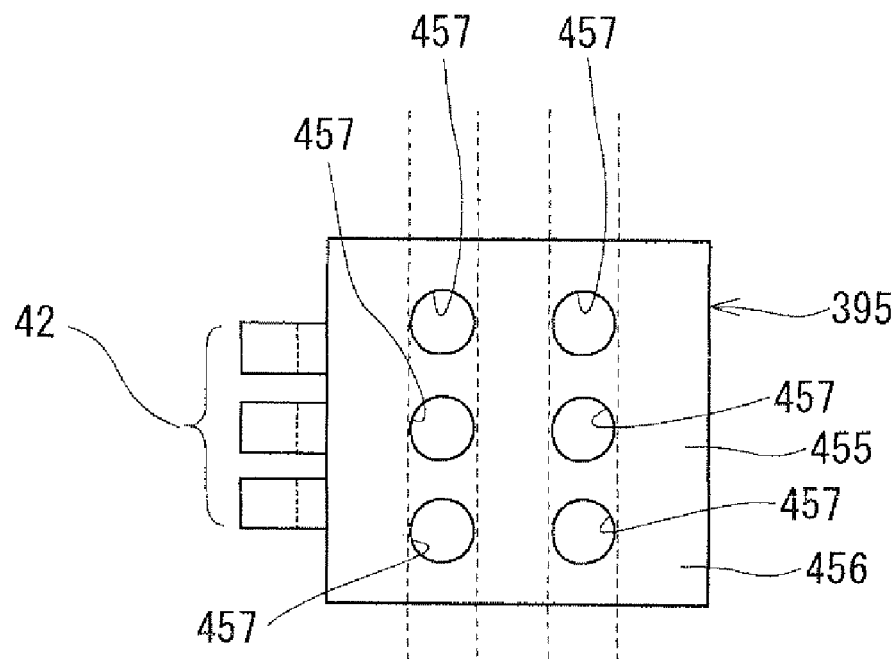
FIG. 14A is a plan view showing an electronic control unit according to an eleventh embodiment of the present invention.
Figure 14B:
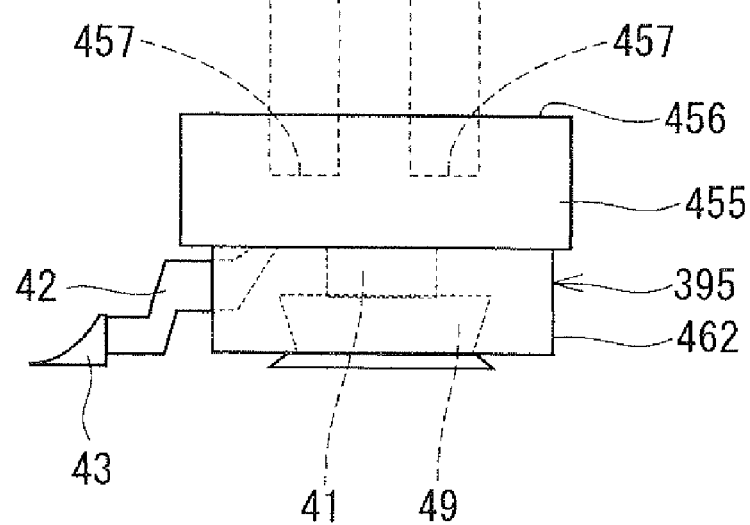
FIG. 14B is a side view showing the electronic control unit according to the eleventh embodiment of the present invention.

The eleventh embodiment of the present invention will be described with reference to FIGS. 14A and 14B. FIG. 14A is a plan view of a power MOS 395, and FIG. 14B is a side view of the power MOS 395. In FIGS. 14A and 14B, a circuit board, a heat releasing gel, a case and the like are not shown.

In the power MOS 395 shown in FIGS. 14A and 14B, as with the tenth embodiment, a large portion of a heat releasing plate 455 is exposed to a side of a cover (not shown) from the resin body 462. The heat releasing plate 455 is formed to be larger than the resin body 462. The heat releasing gel is placed between the cover and an end surface 456 of the heat releasing plate 455, which is opposite side of the resin body 462. The end surface 456 has multiple holes 457, which are formed by cutting or the like, as a movement limiting means.

In the present embodiment, the holes 457 are formed in the end surface 456 of the heat releasing plate 455, which contacts the heat releasing gel. Therefore, as with the above-described embodiments, the movement of the heat releasing gel due to vibration or the like can be limited.

Hereinafter, modified examples of the case will be described in a twelfth embodiment to a fourteenth embodiment. As with FIG. 3 of the first embodiment, electronic components such as an aluminum electrolytic capacitor are not shown in FIGS. 15, 18, 19.

Twelfth Embodiment

Figure 16:
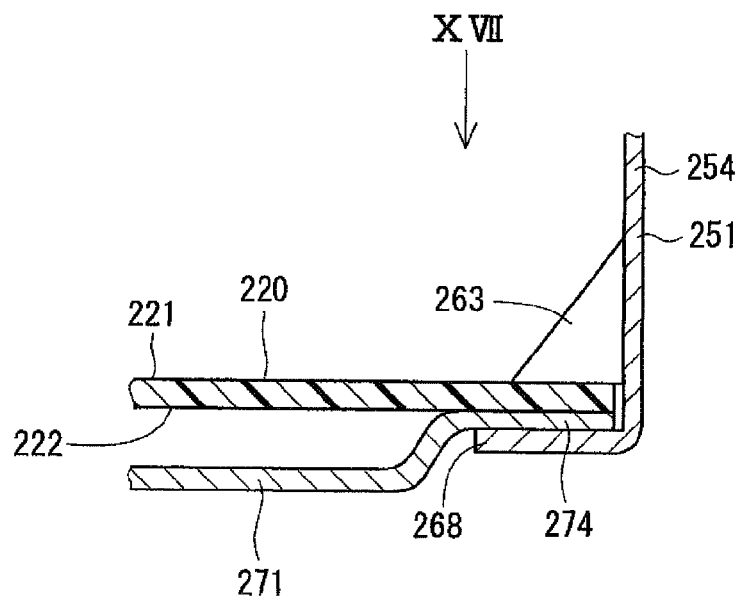
FIG. 16 is a cross-sectional view showing the vicinity of a caulking portion of the electronic control unit according to the twelfth embodiment of the present invention.
Figure 17:
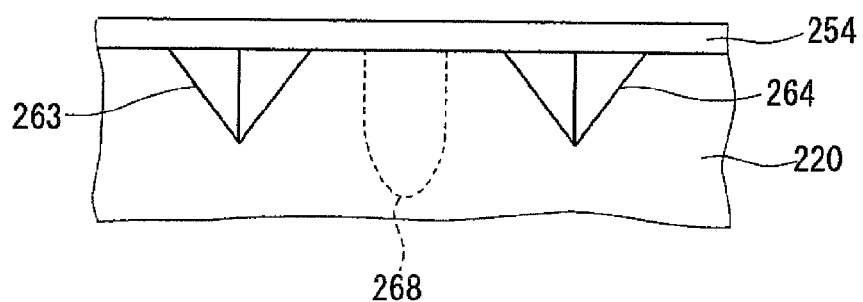
FIG. 17 is a plan view showing the electronic control unit according to the twelfth embodiment of the present invention, viewed from a direction shown by the arrow XVII of FIG. 16.

The twelfth embodiment of the present invention will be described with reference to FIGS. 15 to 17.

Figure 15:
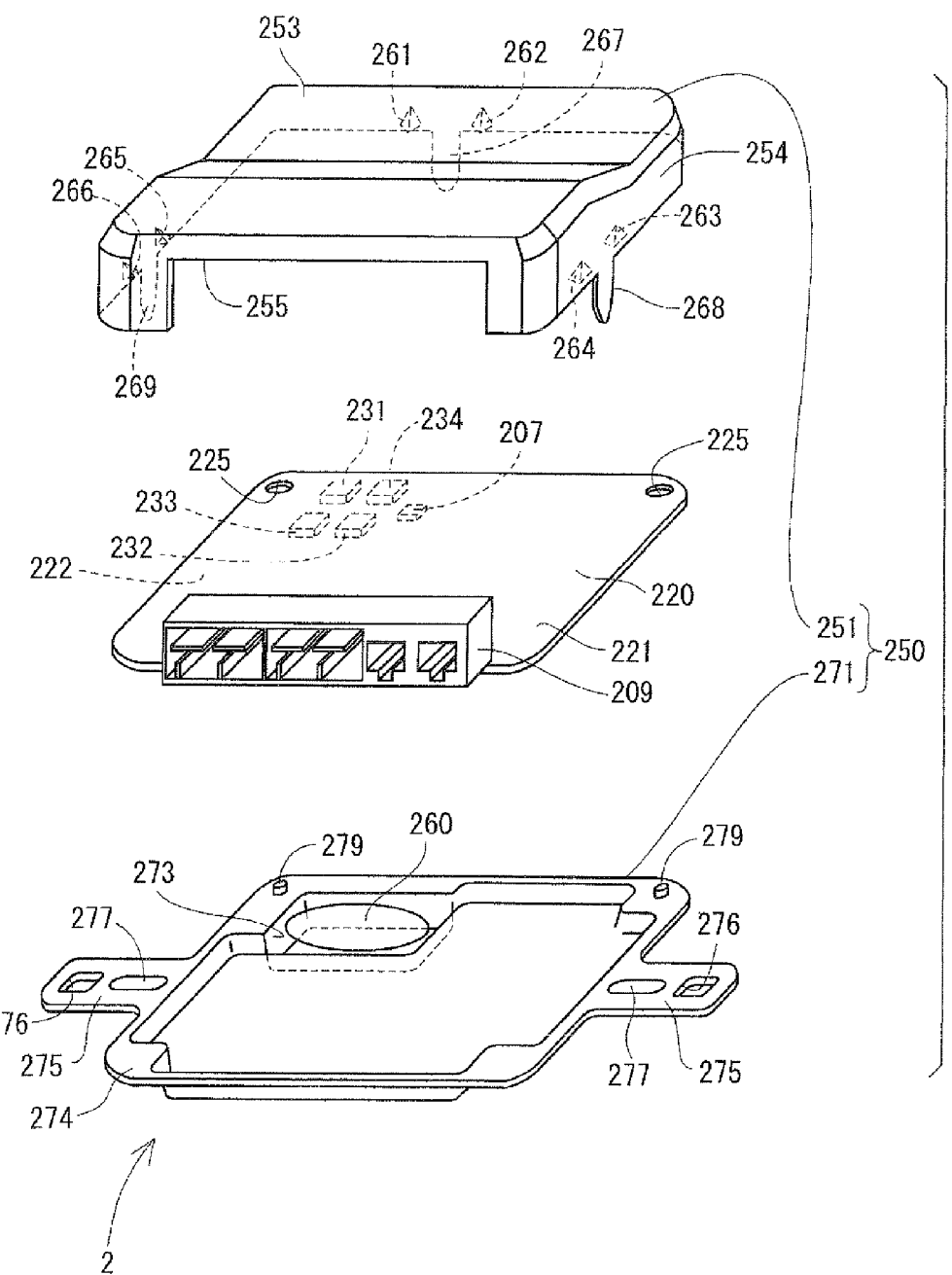
FIG. 15 is an exploded perspective view showing an electronic control unit according to a twelfth embodiment of the present invention.

As shown in FIG. 15, an ECU 2 of the present embodiment includes a circuit board 220, a case 250 and the like.

A connector 209 is formed on a first surface 221 of the circuit board 220, and power MOSs 231 to 234 and a shunt resistance 207 are formed on a second surface 222 of the circuit board 220, which is the opposite surface of the first surface 221. Moreover, the circuit board 220 has a guide hole 225.

The case 250 has a first cover 251 and a second cover 271 which are made of an aluminum plate or a zinc steel plate. By forming the case 250 with an aluminum plate or a zinc steel plate not an aluminum die-casting product, weight of the case 250 can be reduced, and therefore, weight of the ECU 2 as a whole can be reduced. The first cover 251 is placed at a side of the first surface 221 of the circuit board 220, and the second cover 271 is placed at a side of the second surface 222 of the circuit board 220.

The first cover 251 includes a cover surface 253 that is opposed to the circuit board 220, and a side wall 254 formed on an outer peripheral part of the cover surface 253 and in a direction toward the circuit board 220. The side wall 254 has a cutting portion 255 in which the connector 209 is to be received. A surface that is opposed to the surface having the cutting portion 255 and two surfaces that are substantially perpendicular to the surface having the cutting portion 255 of the side wall 254 have claw portions 261 to 266 that protrude inward from the inner surface of the respective surfaces. The claw portions 261 to 266 are formed such that two claw portions thereof are located in the respective surfaces of the side wall 254. That is, the surface that is opposed to the surface having the cutting portion 255 has the claw portions 261, 262. One of the two surfaces that are substantially perpendicular to the surface having the cutting portion 255 has the claw portions 263, 264, and the other of the two surfaces has the claw portions 265, 266. End surfaces of the claw portions 261 to 266 at a side of the circuit board 220 are formed to be substantially perpendicular to the side wall 254. Moreover, the side wall 254 has caulking portions 267 to 269 that protrude toward the side of the circuit board 220. The caulking portion 267 is located between the claw portions 261, 262, the caulking portion 268 is located between the claw portions 263, 264, and the caulking portion 269 is located between the claw portions 265, 266. When the ECU 2 is assembled, the circuit board 220 is fixed to the second cover 271 by the claw portions 261 to 266 and the caulking portions 267 to 269.

As shown in FIG. 15, the second cover 271 has a recess 273 as a movement limiting means for receiving a heat releasing gel 260 and the power MOSs 231 to 234. Moreover, the second cover 271 has an outer peripheral portion 274 at the outer peripheral part thereof. The outer peripheral portion 274 is formed to be substantially parallel to the bottom surface of the second cover 271. The second cover 271 has a fixation portion 275 which protrudes outward from the outer peripheral portion 274. The fixation portion 275 is formed to be substantially parallel to the outer peripheral portion 274. The fixation portion 275 has a fixation hole 276 for fixing the ECU 2 to the vehicle, and a distortion-limiting rib 277. Moreover, the second cover 271 has a guide portion 279 protruding toward the side of the circuit board 220 at a position corresponding to the guide hole 225 of the circuit board 220. Thus, the circuit board 220 is positioned with respect to the second cover 271.

In assembling the ECU 2, a method for fixing the circuit board 220 to the second cover 271 by the claw portions 261 to 266 and the caulking portions 267 to 269 will be described with reference to FIGS. 15 to 17. Although a portion in the vicinity of the claw portions 263, 264 and the caulking portion 268 is shown in FIGS. 16 and 17, other claw portions and caulking portions have the same configuration with the claw portions 263, 264 and the caulking portion 268.

The guide portion 279 of the second cover 271 is inserted into the guide hole 225 of the circuit board 220, and the circuit board 220 is positioned with respect to the second cover 271. When the first cover 251 is placed over an upper portion of the circuit board 220, the end surfaces of the claw portions 261 to 266 at the side of the circuit board 220 contact the first surface 221 of the circuit board 220. The caulking portions 267 to 269 are caulked by bending the caulking portions 267 to 269 and pushing the circuit board 220 against the claw portions 261 to 266 so that the circuit board 220 and the second cover 271 are sandwiched between the claw portions 261 to 266 and the caulking portion 267 to 269.

In the present embodiment, the second cover 271 has the recess 273. Therefore, as with the above-described embodiments, the movement of the heat releasing gel 260 due to vibration or the like can be limited.

Specifically, the ECU 2 of the present embodiment has a feature in the case 250. The first cover 251 of the case 250 has the claw portions 261 to 266 and the caulking portions 267 to 269. The caulking portions 267 to 269 are caulked, and thereby the circuit board 220 and the second cover 271 are sandwiched between the claw portions 261 to 266 and the caulking portions 267 to 269. Thus, a screw for fixing the circuit board 220, the first cover 251 and the second cover 271 becomes unnecessary. Therefore, the number of components can be reduced. Furthermore, the number of assembling steps can also be reduced.

Thirteenth Embodiment

Figure 18:
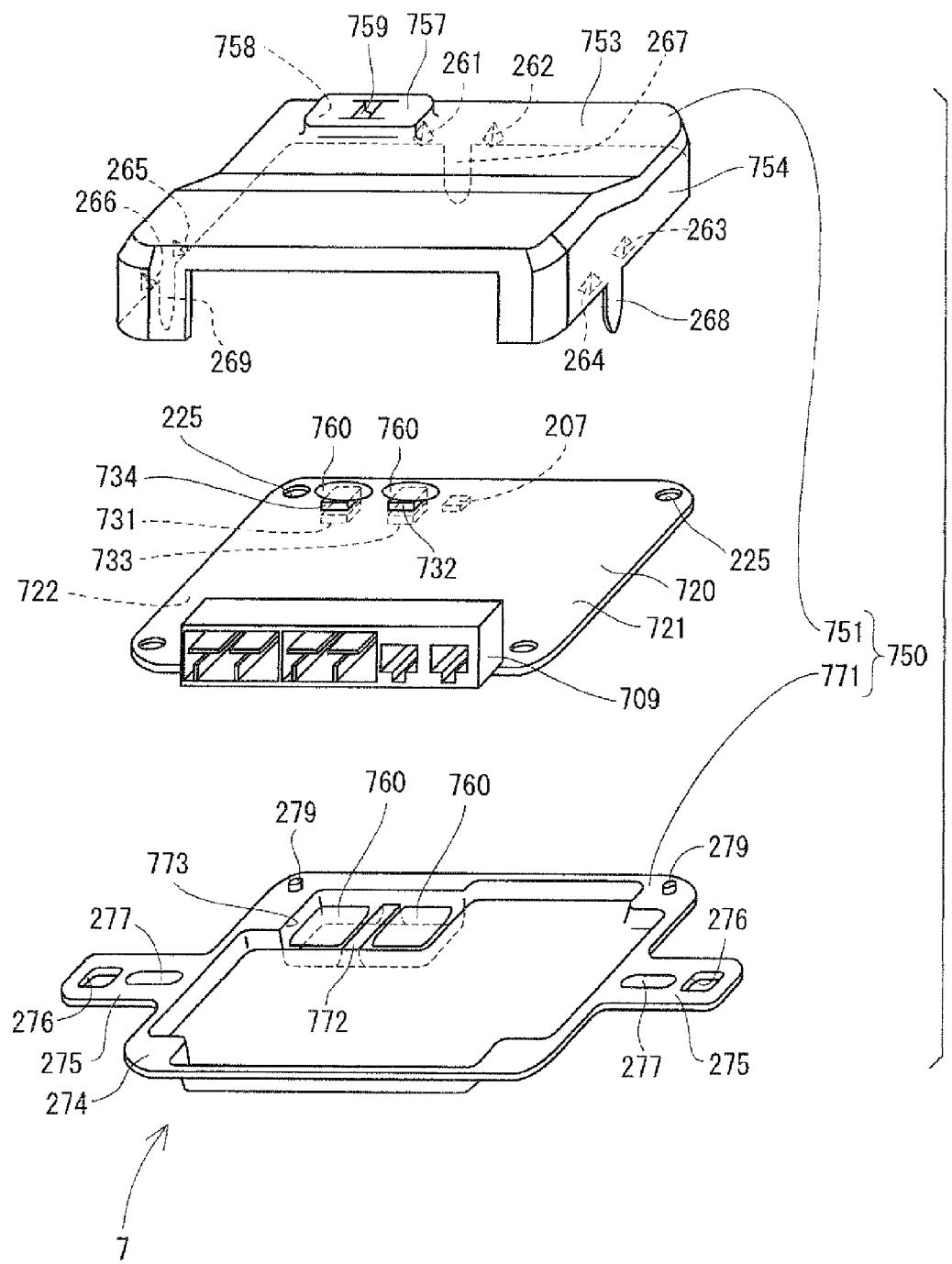
FIG. 18 is an exploded perspective view showing an electronic control unit according to a thirteenth embodiment of the present invention.

The thirteenth embodiment of the present invention will be described with reference to FIG. 18.

An ECU 7 of the present embodiment includes a circuit board 720, a case 750 and the like.

A connector 709 and power MOSs 732, 734 are formed on a first surface 721 of the circuit board 720. Power MOSs 731, 733 and the shunt resistance 207 are formed on a second surface 722 of the circuit board 720, which is the opposite surface of the first surface 721. The power MOS 734 is placed on the reverse side of the power MOS 731, and the power MOS 732 is placed on the reverse side of the power MOS 733. In the present embodiment, the power MOSs 731, 732, 733, 734 correspond to the power MOSs 31, 32, 33, 34 of the first embodiment, respectively. When a steering wheel is turned to the right, the obliquely-positioned power MOSs 731, 732 are turned on. When the steering wheel is turned to the left, the obliquely-positioned power MOSs 733, 734 are turned on. That is, the power MOSs, which are turned on at the same time, are respectively placed on the different surfaces of the circuit board, and are placed separately from each other. Thus, thermal interference is suppressed.

As with the case 250 of the twelfth embodiment, the case 750 has a first cover 751 and a second cover 771 which are made of an aluminum plate or a zinc steel plate. By forming the case 750 with an aluminum plate or a zinc steel plate not an aluminum die-casting product, weight of the case 750 can be reduced, and therefore, weight of the ECU 7 as a whole can be reduced. The first cover 751 is placed at a side of the first surface 721 of the circuit board 720, and the second cover 771 is placed at a side of the second surface 722 of the circuit board 720.

The first cover 751 includes a cover surface 753 that is opposed to the circuit board 720, and a side wall 754 formed on an outer peripheral part of the cover surface 753 and in a direction toward the circuit board 720. The cover surface 753 has a receiving portion 757 for receiving a heat releasing gel 760 and the power MOSs 732, 734. The receiving portion 757 has therein a recess 758 as a movement limiting means. Moreover, a cover rib 759 as a movement limiting means for separating the power MOSs 732, 734 is formed inside the recess 758.

As with the twelfth embodiment, the first cover 751 has the claw portions 261 to 266 and the caulking portions 267 to 269. The ECU 7 can be assembled by the same method described in the twelfth embodiment. Thus, a screw for fixing the circuit board 720, the first cover 751 and the second cover 771 becomes unnecessary. Therefore, the number of components and the number of assembling steps can be reduced.

The second cover 771 has a recess 773 as a movement limiting means for receiving the heat releasing gel 760 and the power MOSs 731, 733. Moreover, a cover rib 772 as a movement limiting means for separating the power MOSs 731, 733 is formed inside the recess 773.

In the present embodiment, the first cover 751 has the recess 758, and the second cover 771 has the recess 773. Therefore, as with the above-described embodiments, the movement of the heat releasing gel 760 due to vibration or the like can be limited.

Moreover, the cover rib 759 for separating the power MOSs 732, 734 is formed inside the recess 758 of the first cover 751. The cover rib 772 for separating the power MOSs 731, 733 is formed inside the recess 773 of the second cover 771. Thus, the movement of the heat releasing gel 760 can be limited. Furthermore, the heat releasing performance can be improved due to increasing of a surface area for radiating heat, and distortion of the first cover 751 and the second cover 771 can be limited. Furthermore, the application quantity of the heat releasing gel 760 can be reduced.

In the present embodiment, the power MOSs 732, 734 are placed on the first surface 721 of the circuit board 720, and the power MOSs 731, 733 are placed on the second surface 722 of the circuit board 720, which is the opposite surface of the first surface 721. The heat generated from the power MOSs 732, 734 is released to the first cover 751 through the heat releasing gel 760. The heat generated from the power MOSs 731, 733 is released to the second cover 771 through the heat releasing gel 760. Thus, the heat interference between the power MOSs 731, 733 and the power MOSs 732, 734 can be limited, and heat can be released with high efficiency. Furthermore, the power MOSs 731 to 734 are installed to the both surfaces of the circuit board 720, and thereby the ECU 7 can be miniaturized.

Fourteenth Embodiment

Figure 19:
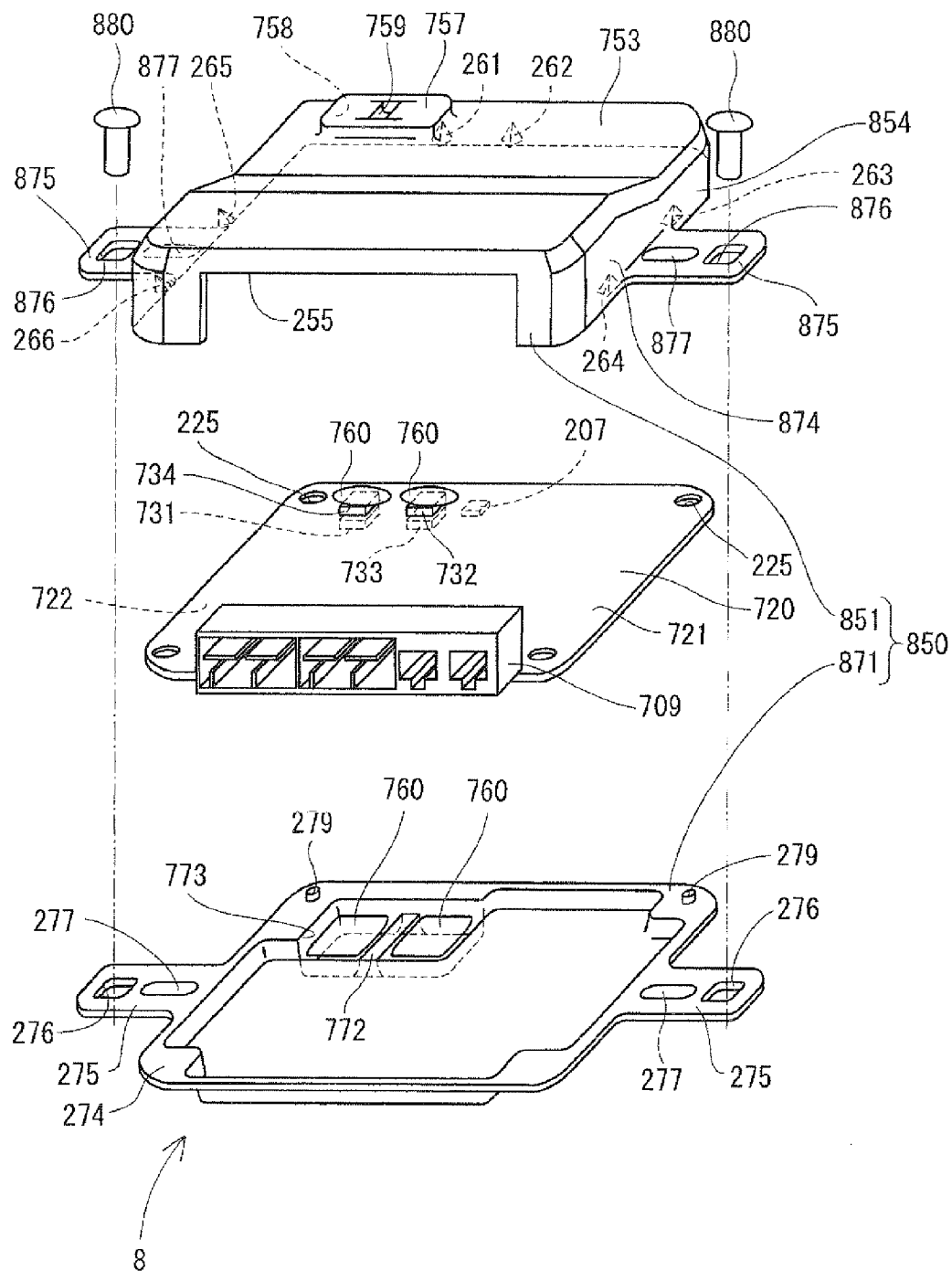
FIG. 19 is an exploded perspective view showing an electronic control unit according to a fourteenth embodiment of the present invention.

The fourteenth embodiment of the present invention will be described with reference to FIG. 19. The fourteenth embodiment is a modified example of the thirteenth embodiment.

In an ECU 8 of the fourteenth embodiment, a first cover 851 of a case 850 has no caulking portions. In contrast, the first cover 851 has a fixation portion 875 which protrudes outward from a side wall 854 thereof. The fixation portion 875 is formed to be substantially parallel to the cover surface 753 of the first cover 851. The fixation portion 875 is formed at a position corresponding to the fixation portion 275 of a second cover 871. As with the fixation portion 275 of the second cover 871, the fixation portion 875 has a fixation hole 876 for fixing the ECU 8 to the vehicle, and a distortion-limiting rib 877.

According to the present embodiment, in fixing the ECU 8 to the vehicle, the guide portion 279 of the second cover 871 is inserted into the guide hole 225 of the circuit board 720 so that the circuit board 720 is positioned with respect to the second cover 871. Then, the first cover 851 is placed over the circuit board 720. After that, a screw 880 is inserted into the fixation hole 876 of the first cover 851 and the fixation hole 276 of the second cover 871, and the first cover 851 and the second cover 871 are fastened together with the screw 880.

Thus, the fourteenth embodiment has similar effects to the thirteenth embodiment. Furthermore, since the caulking process can be omitted, the number of assembling steps can be reduced.

Other Embodiments

In the above-described embodiments, various movement limiting means of the heat releasing gel and various structures of the case are described. However, these configurations can be arbitrarily combined. For example, after the roughening process of a portion of the case or the heat releasing plate, which contacts the heat releasing gel, a groove portion or a recess may be formed.

In the above-described embodiments, the case is made of metal such as aluminum. However, the case may be made of other material such as resin. Furthermore, the shape of the groove portion is not limited to the square shape. The groove portion may be a rounded shape or a shape having multiple protruding cylinders or columns.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. An electronic control unit comprising:
    a circuit board;
    a semiconductor device that is installed to the circuit board and includes a semiconductor chip, a plurality of leads and a resin body, wherein the semiconductor chip is electrically connected to the circuit board through the plurality of leads and is molded in the resin body;
    a case that receives the semiconductor device;
    a heat releasing gel that contacts the semiconductor device and conducts heat generated from the semiconductor device to a portion of the case located on one side of the semiconductor device, which is opposite from the circuit board; and
    a movement limiting means for limiting movement of the heat releasing gel at a location between the circuit board and the case, wherein
    the movement limiting means includes a projection, which is formed in an outer peripheral part of a surface of the resin body, which is opposed to the case.

2. The electronic control unit according to claim 1, wherein the movement limiting means includes a recess, which is formed in the portion of the case, which is opposed to the semiconductor device.

3. The electronic control unit according to claim 1, wherein the movement limiting means includes a plurality of groove portions, which are formed in the portion of the case, which is opposed to the semiconductor device.

4. The electronic control unit according to claim 1, wherein the movement limiting means includes a wall portion, which is formed between the circuit board and the case so as to surround a side surface of the semiconductor device.

5. The electronic control unit according to claim 1, wherein the movement limiting means includes a protection member, which covers a surface of the heat releasing gel.

6. The electronic control unit according to claim 1, wherein the movement limiting means includes a roughening portion, which is formed in the portion of the case, which contacts the heat releasing gel.

7. The electronic control unit according to claim 1, wherein the semiconductor device includes a plurality of semiconductor device portions, and the semiconductor device portions are installed to the circuit board.

8. The electronic control unit according to claim 7, wherein at least one of the semiconductor device portions is installed to a first surface of the circuit board, and at least another one of the semiconductor device portions is installed to a second surface of the circuit board, which is opposite from the first surface.

9. The electronic control unit according to claim 7, wherein the heat releasing gel is placed on each of the semiconductor device portions.

10. The electronic control unit according to claim 9, wherein
    the movement limiting means includes a rib, which is formed in the case, and
    the rib separates the semiconductor device portions.

11. The electronic control unit according to claim 1, wherein
    the case includes a first cover and a second cover, and
    the first cover covers a first surface of the circuit board and the second cover covers a second surface of the circuit board, which is opposite from the first surface.

12. The electronic control unit according to claim 11, wherein
    the first cover includes:
        a cover surface that is opposed to the circuit board;
        a side wall formed in an outer peripheral part of the cover surface and in a direction toward the circuit board; and
        a claw portion for latching the circuit board, which protrudes inward from an inner surface of the side wall.

13. The electronic control unit according to claim 12, wherein
    the first cover includes a caulking portion, and
    the circuit board and the second cover are sandwiched between the claw portion and the caulking portion.

14. The electronic control unit according to claim 12, wherein
    an end surface of the claw portion at a side of the circuit board is formed to have a planar shape that is substantially perpendicular to the side wall.

15. The electronic control unit according to claim 11, wherein
    at least one of the first cover and the second cover has a fixation portion having a fixation hole, and
    the fixation portion protrudes outward from an outer peripheral part of the at least one of the first cover and the second cover.

16. The electronic control unit according to claim 11, wherein
    the second cover has a guide portion protruding toward the circuit board, and
    the circuit board has a guide hole, which is formed at a location corresponding to the guide portion.

17. An electronic control unit comprising:
    a circuit board;
    a semiconductor device that is installed to the circuit board and includes a semiconductor chip, a plurality of leads and a resin body, wherein the semiconductor chip is electrically connected to the circuit board through the plurality of leads and is molded in the resin body;
    a case that receives the semiconductor device;
    a heat releasing gel that contacts the semiconductor device and conducts heat generated from the semiconductor device to a portion of the case located on one side of the semiconductor device, which is opposite from the circuit board; and
    a movement limiting means for limiting movement of the heat releasing gel at a location between the circuit board and the case, wherein
    the movement limiting means includes a sheet member having an adhesive property, which is formed between the heat releasing gel and the case.

18. An electronic control unit, comprising:
a circuit board;
a semiconductor device that is installed to the circuit board and includes a semiconductor chip, a plurality of leads and a resin body, wherein the semiconductor chip is electrically connected to the circuit board through the plurality of leads and is molded in the resin body;
a case that receives the semiconductor device;
a heat releasing gel that contacts the semiconductor device and conducts heat generated from the semiconductor device to a portion of the case located on one side of the semiconductor device, which is opposite from the circuit board;
a movement limiting means for limiting movement of the heat releasing gel at a location between the circuit board and the case; and
a heat releasing plate in the semiconductor device, wherein the heat releasing plate contacts one surface of the semiconductor chip, which is opposite from the circuit board, at least a part of the heat releasing plate is exposed from the resin body, and
the heat releasing plate contacts the heat releasing gel.

19. The electronic control unit according to claim 18, wherein
the movement limiting means includes a roughening portion, which is formed in a portion of the heat releasing plate, which contacts the heat releasing gel.

20. The electronic control unit according to claim 18, wherein
the movement limiting means includes a plurality of groove portions, which are formed in the heat releasing plate.

21. The electronic control unit according to claim 18, wherein
the movement limiting means includes a hole portion, which is formed in the heat releasing plate.

* * * * *